(12) United States Patent
Kawashiri et al.

(10) Patent No.: US 9,391,183 B2
(45) Date of Patent: *Jul. 12, 2016

(54) SEMICONDUCTOR DEVICE

(71) Applicant: Sanken Electric Co., Ltd., Niiza-Shi, Saitama (JP)

(72) Inventors: Satoshi Kawashiri, Niiza (JP); Kazuko Ogawa, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/669,189

(22) Filed: Mar. 26, 2015

(65) Prior Publication Data

US 2015/0263151 A1    Sep. 17, 2015

Related U.S. Application Data

(63) Continuation of application No. PCT/JP2014/072811, filed on Aug. 29, 2014.

(30) Foreign Application Priority Data

| Sep. 20, 2013 | (JP) | ............................... P2013-194834 |
| Jul. 18, 2014 | (JP) | ............................... 2014-003865 U |
| Jul. 18, 2014 | (JP) | ............................... P2014-148356 |
| Jul. 30, 2014 | (JP) | ............................... P2014-155442 |

(51) Int. Cl.
*H01L 29/423* (2006.01)
*H01L 29/739* (2006.01)
(Continued)

(52) U.S. Cl.
CPC ............ *H01L 29/7397* (2013.01); *H01L 21/28* (2013.01); *H01L 29/0692* (2013.01); *H01L 29/41* (2013.01); *H01L 29/417* (2013.01); *H01L 29/423* (2013.01); *H01L 29/4236* (2013.01); *H01L 29/4238* (2013.01);
(Continued)

(58) Field of Classification Search
CPC ............ H01L 29/4941; H01L 29/7813; H01L 29/7811; H01L 29/66333; H01L 29/66348; H01L 29/7397; H01L 29/66007; H01L 29/7396; H01L 21/2815; H01L 29/42304; H01L 21/28; H01L 29/4236; H01L 29/42368
See application file for complete search history.

(56) References Cited

U.S. PATENT DOCUMENTS 9,059,237 B2 *   6/2015   Ogawa ................ H01L 29/7397
9,190,504 B2 *   11/2015   Kawashiri ........... H01L 29/7396
(Continued)

FOREIGN PATENT DOCUMENTS

JP        2002-353456 A     12/2002

*Primary Examiner* — Jarrett Stark
*Assistant Examiner* — Bitew Dinke
(74) *Attorney, Agent, or Firm* — Mots Law, PLLC

(57) ABSTRACT

A semiconductor device is disclosed that comprises semiconductor regions and an insulating film. A groove extends from a top surface of a semiconductor region and reaching a semiconductor region. In plan view, a body of a bottom electrode is formed in a strip form, and extends in an extending direction of the groove, and the connection portion extends in a depth direction of the groove and is connected to an end of the body in the extending direction of the body. The body of the bottom electrode is arranged in the groove, and the connection portion of the bottom electrode is arranged in the connection groove. In plan view, a length of the groove in the extending direction of the groove is larger than a width of the groove, and the width of the groove is larger than a gap between the groove and an adjacent groove.

13 Claims, 12 Drawing Sheets

(51) Int. Cl.
*H01L 21/28* (2006.01)
*H01L 29/41* (2006.01)
*H01L 29/417* (2006.01)
*H01L 29/78* (2006.01)
*H01L 29/06* (2006.01)
*H01L 29/10* (2006.01)

(52) U.S. Cl.
CPC ... *H01L 29/42304* (2013.01); *H01L 29/42368* (2013.01); *H01L 29/42376* (2013.01); *H01L 29/78* (2013.01); *H01L 29/1095* (2013.01); *H01L 29/41708* (2013.01)

(56) References Cited

U.S. PATENT DOCUMENTS

| | | | |
|---|---|---|---|
| 2007/0108511 A1* | 5/2007 | Hirler | H01L 29/407 257/328 |
| 2007/0138547 A1* | 6/2007 | Nakamura | H01L 29/66719 257/331 |
| 2011/0291186 A1* | 12/2011 | Yilmaz | H01L 29/4236 257/334 |
| 2012/0012924 A1* | 1/2012 | Meiser | H01L 29/42392 257/330 |
| 2012/0025304 A1* | 2/2012 | Blank | H01L 29/407 257/331 |
| 2012/0187477 A1* | 7/2012 | Hsieh | H01L 29/0634 257/331 |
| 2013/0334565 A1* | 12/2013 | Hutzler | H01L 29/66333 257/139 |
| 2014/0015041 A1* | 1/2014 | Chan | H01L 29/7827 257/330 |
| 2015/0069536 A1* | 3/2015 | Kim | H01L 29/4941 257/412 |
| 2015/0084123 A1* | 3/2015 | Kawashiri | H01L 29/7813 257/330 |
| 2015/0108540 A1* | 4/2015 | Ogawa | H01L 29/7397 257/139 |

* cited by examiner

SEMICONDUCTOR DEVICE

CROSS REFERENCE TO RELATED APPLICATIONS

This application is a continuation application of International Application PCT/JP2014/072811, filed on Aug. 29, 2014, which claims its priority under Article 8 of the Patent Cooperation Treaty based on Japanese Patent Application No. 2013-194834, filed on Sep. 20, 2013, Japanese Patent Application No. 2014-148356, fined on Jul. 18, 2014, Japanese utility model registration application No. 2014-003865, filed on Jul. 18, 2014, and Japanese Patent Application No. 2014-155442, filed on Jul. 30, 2014, the entire contents of which are hereby incorporated by reference.

BACKGROUND

This disclosure relates to structures of trench gate type semiconductor devices performing switching operation.

Insulated gate bipolar transistors (IGBTs) having high input impedance and low on-voltage are used in motor driving circuits. The IGBTs, however, have a trade-off relation between breakdown voltage and on-voltage.

For such features of the IGBTs, a variety of approaches have been proposed to reduce the on-voltage while keeping the breakdown voltage high. For example, a structure has been proposed in which an n-type layer having a high impurity concentration than that of a drift region and configured to accumulate holes (hereinafter referred to as "carrier accumulation layer") is arranged between a base region and the drift region. Such a structure can prevent holes from a collector region from reaching an emitter electrode, thereby decreasing the on-voltage (for example, see Japanese Patent Application Publication No. 2002-353456 (PTL 1)).

SUMMARY

One aspect according to an embodiment provides a semiconductor device including (A) a first semiconductor region of a first conductivity type, (B) a second semiconductor region of a second conductivity type arranged on the first semiconductor region, (C) a third semiconductor region of the first conductivity type arranged on the second semiconductor region, (D) fourth semiconductor regions of the second conductivity type arranged on the third semiconductor region, (E) an insulation film arranged on an inner wall of a groove extending from the top surface of the fourth semiconductor region and reaching the second semiconductor region through the fourth semiconductor region and the third semiconductor region, (F) a control electrode arranged on a region of the insulation film at a side surface of the groove where the insulation film faces the third semiconductor region, (G) a first main electrode electrically connected to the first semiconductor region, (H) a second main electrode electrically connected to the fourth semiconductor region, and (I) a bottom electrode arranged on the insulation film at the bottom surface of the groove and spaced from the control electrode, the bottom electrode electrically connected to the second main electrode, wherein in plan view, the length of the groove in an extending direction thereof is equal to or more than the width of the groove, and the width of the groove is larger than the gap between the groove and an adjacent groove.

Another embodiment provides a semiconductor device including (A) first semiconductor region of a first conductivity type, (B) a second semiconductor region of a second conductivity type arranged on the first semiconductor region, (C) a third semiconductor region of the first conductivity type arranged on the second semiconductor region, (D) fourth semiconductor regions of the second conductivity type arranged on the third semiconductor region, (E) an insulation film arranged on an inner wall of groove extending from the top surface of the fourth semiconductor region and reaching the second semiconductor region through the fourth semiconductor region and the third semiconductor region, (F) a control electrode arranged on a region of the insulation film at a side surface of the groove where the insulation film faces the third semiconductor region, (G) a bottom electrode arranged on the insulation film and spaced from the control electrode on the bottom surface of the groove, (H) a first main electrode electrically connected to the first semiconductor region, (I) an interlayer insulation film arranged on the control electrode and the bottom electrode, and (J) a second main electrode arranged on the interlayer insulation film arranged on the third semiconductor region and on the fourth semiconductor regions and above the control electrode and the bottom electrode with the interlayer insulation film interposed in between, the second main electrode electrically connecting the fourth semiconductor region to the bottom electrode, wherein in plan view, the area of the groove is larger than the area of the semiconductor region between the groove and an adjacent groove.

BRIEF DESCRIPTION OF THE DRAWINGS

FIG. 8A is a plan view, and FIG. 8B is a sectional view taken along the VIII-VIII direction in FIG. 8A.

DETAILED DESCRIPTION OF EMBODIMENTS

Figure 1:
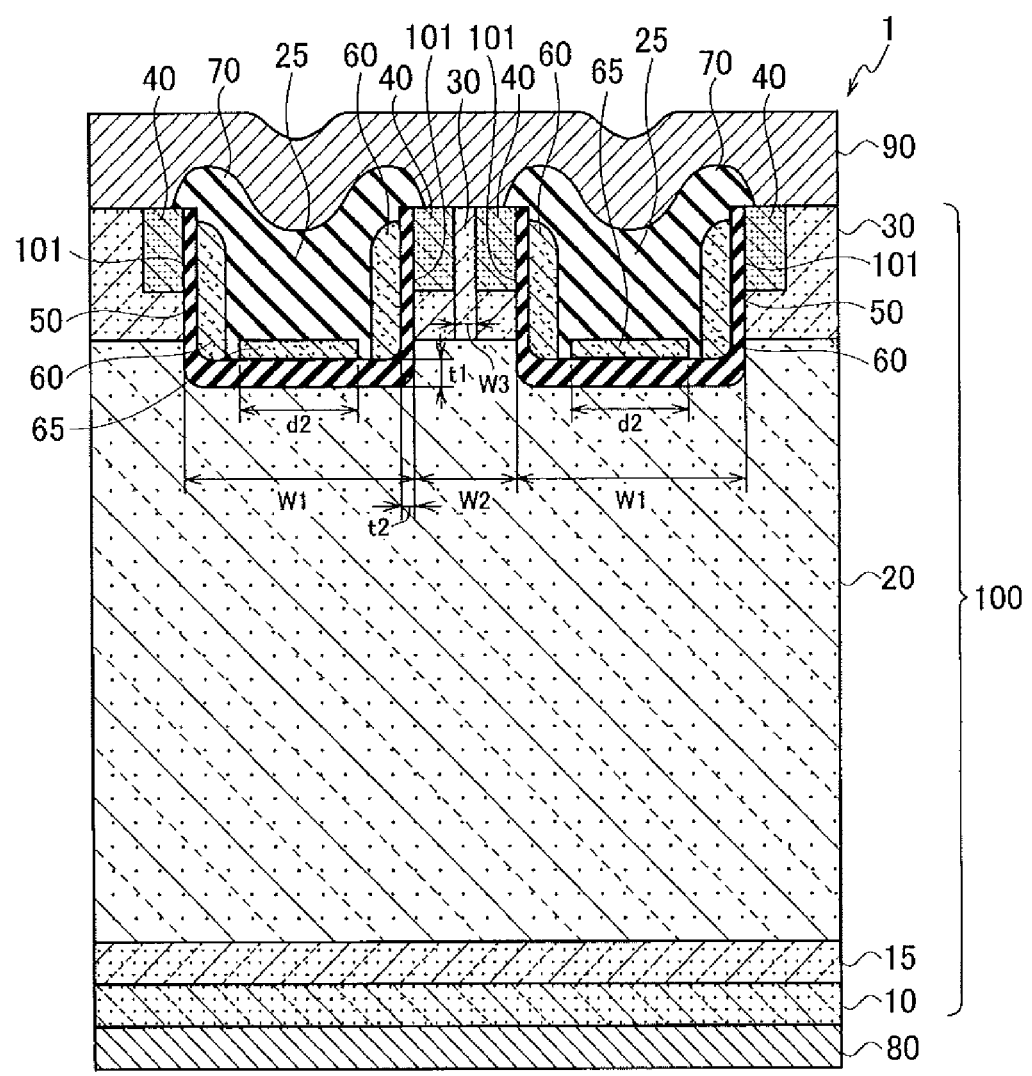
FIG. 1 is a schematic sectional view illustrating the structure of a semiconductor device according to one embodiment.

Embodiments will now be described with reference to the drawings. Note that the same or similar portions are denoted by the same or similar reference numerals in the descriptions of the drawings below. It should be noted, however, that the drawings are schematic only, and that ratios of respective dimensions and the like differ from those in reality. Accordingly, specific dimensions and the like should be determined in consideration of the descriptions below. In addition, some of the dimensional relations and ratios differ in the drawings as a matter of course.

Moreover, the following embodiments exemplify apparatuses and methods for embodying technical ideas of the invention, by which shapes, structures, and arrangements of components will not be limited to those described below. The embodiments of this invention can be modified in many ways without departing from the scope of claims.

As illustrated in FIG. 1, semiconductor device 1 according to one embodiment includes semiconductor substrate 100, first semiconductor region 10 of a first conductivity type, second semiconductor region 20 of a second conductivity type arranged on first semiconductor region 10, third semiconductor region 30 of the first conductivity type arranged on second semiconductor region 20, and fourth semiconductor region 40 of a second conductivity type arranged on third semiconductor region 30.

As illustrated in FIG. 1, grooves 25 are arranged, each groove 25 extending from the top surface of fourth semiconductor region 40 through fourth semiconductor region 40 and third semiconductor region 30 to second semiconductor region 20. Insulation film 50 is arranged on the inner wall of each of grooves 25. The inner side walls of groove 25 has control electrodes 60 each arranged on insulation film 50 and facing the side surface of third semiconductor region 30. The inner bottom wall of groove 25 has bottom electrode 65 arranged on insulation film 50 and spaced from control electrodes 60. Semiconductor device 1 includes first main electrode 80 electrically connected to first semiconductor region 10 and second main electrode 90 electrically connected to third semiconductor region 30 and fourth semiconductor region 40. Second main electrode 90 is optionally not electrically connected to third semiconductor region 30. Bottom electrode 65 is electrically connected to second main electrode 90.

The first conductivity type is opposite to the second conductivity type. Namely, if the first conductivity type is the n-type, the second conductivity type is the p-type; if the first conductivity type is the p-type, the second conductivity type is the n-type. An exemplary case will now be described in which the first conductivity type is the p-type and the second conductivity type is the n-type.

As described above, semiconductor device 1 illustrated in FIG. 1 is a trench gate type IGBT. For easy understanding of explanation, the following description refers to first semiconductor region 10 as p-type collector region 10, second semiconductor region 20 as n-type drift region 20, third semiconductor region 30 as p-type base region 30, and fourth semiconductor region 40 as n-type emitter region 40. Emitter regions 40 are selectively embedded into part of the top surface of base region 30. In semiconductor device 1, the respective semiconductor regions have the following impurity concentrations and thicknesses, for example.

Emitter region 40 has a thickness of 0.3 μm to 1 μm and an impurity concentration of $1\times10^{18}$ cm$^{-3}$ to $1\times10^{20}$ cm$^{-3}$. Base region 30 has a thickness of about 4 μm and an impurity concentration of $5\times10^{16}$ cm$^{-3}$ to $1\times10^{18}$ cm$^{-3}$. Drift region 20 has a thickness of 40 μm or more and 140 μm or less and desirably has a resistivity of 10 Ωcm or more and 150 Ωcm or less. Collector region 10 has thickness of 0.1 μm to 300 μm and an impurity concentration of $1\times10^{17}$ cm$^{-3}$ to $1\times10^{19}$ cm$^{-3}$.

In the example illustrated in FIG. 1, n-type buffer layer 15 is arranged between drift region 20 and collector region 10.

The following description refers to Control electrode 60 as gate electrode 60, first main electrode 80 as collector electrode 80, and second main electrode 90 as emitter electrode 90. The surface of base region 30 facing gate electrode 60 defines channel formation region 101. Namely, the region of insulation film 50 arranged on the side walls of grooves 25 functions as a gate insulation film.

In semiconductor device 1 illustrated in FIG. 1, groove 25 has a width W1 larger than the depth of groove 25. For example, groove 25 has width W1 of 3 μm to 20 μm, more preferably 3 μm to 15 μm, still more preferably 6 μm to 15 μm. The groove 25 has a depth of 2 μm to 10 μm, for example, about 5 μm. Width W1 of groove 25 is preferably larger than gap W2 of adjacent grooves 25. For example, gap W2 between grooves 25 is 2 to 4 μm.

In the embodiment, width W1 of groove 25 indicates the width on the extended line of the interface between base region 30 and drift region 20 as illustrated in FIG. 1. In the embodiment, gap W2 of the adjacent grooves 25 indicates the gap between grooves 25 on the extended line of the interface between base region 30 and drift region 20. The width of base region 30 located between grooves 25 and exposed on the surface of semiconductor substrate 100, i.e., the width of the contact portion of base region 30 and emitter electrode 90 is referred to as "width of a connection region" and is expressed as width W3 in FIG. 1. The "width of a connection region" indicates the width orthogonal to the extending direction of groove 25, which is vertical to the paper in FIG. 1. Namely, the "width of a connection region" indicates the length parallel to the widthwise direction of groove 25.

Gate electrode 60 includes a pair of left and right gate electrodes 60 arranged on side surfaces of groove 25 (first and second side surfaces). Each gate electrode is arranged on insulation film 50 while facing base region 30. Although the cross sectional view in FIG. 1 illustrates left and right gate electrodes 60 separated from each other, left and right gate electrodes 60 are electrically connected to each other via a gate connection portion of connection groove 125 as described later. Gate electrode 60 and the gate connection portion are formed of a conductive polycrystalline silicon film doped with an impurity in a high concentration of 1E19 atom/cm$^3$ or more and 1E20 atom/cm$^3$ or less, for example.

According to the embodiment, gate electrode 60 is not arranged in the central portion of the bottom surface of groove 25.

Namely, gate electrodes 60 arranged along the side surfaces of groove 25 are formed from the surface of semiconductor substrate 100 toward the bottom surface of groove 25 but not formed in the central portion of the bottom surface of groove 25. Bottom electrode 65 facing drift region 20 is arranged on insulation film 50 within the bottom surface of groove 25 not having gate electrode 60 formed thereon. Bottom electrode 65 is formed of a conductive polycrystalline silicon film doped with an impurity in a high concentration of 1E19 atom/cm$^3$ or more and 1E20 atom/cm$^3$ or less, for example. Bottom electrode 65 extends from the first side surface of groove 25 to the second side surface of groove 25. Bottom electrode 65 is spaced from left and right gate electrodes 60 to be electrically separated (insulated) from left and right gate electrodes 60.

Interlayer insulation film 70 is arranged in groove 25 to cover left and right gate electrodes 60 and bottom electrode 65. Interlayer insulation film 70 is arranged on bottom electrode 65 and between left and right gate electrodes 60 to electrically insulate bottom electrode 65 from left and right gate electrodes 60. Emitter electrode 90 is arranged on the surface of semiconductor substrate 100. Interlayer insulation film 70 is also arranged between emitter electrode 90 and gate electrode 60 and bottom electrode 65.

Interlayer insulation film 70 has openings on semiconductor substrate 100 between adjacent grooves 25. Emitter electrode 90 covering the surface of semiconductor substrate 100 is arranged the top surfaces of base region 30 and emitter region 40 via the openings of interlayer insulation film 70. In the above configuration, emitter electrode 90 is electrically connected to base region 30 and emitter region 40 on the surface of semiconductor substrate 100. Emitter electrode 90 is electrically connected to bottom electrode 65 arranged on the bottom surface of groove 25 as described later.

Figure 9:
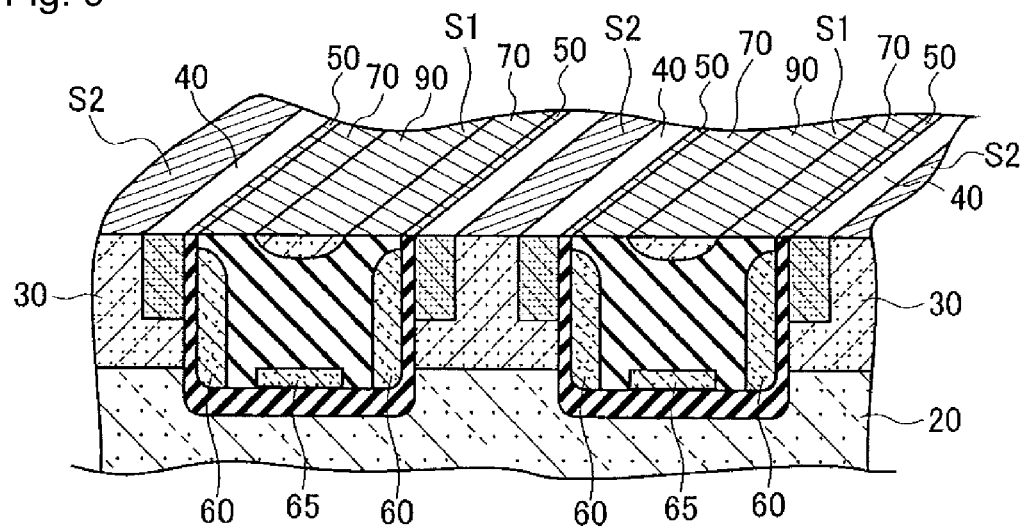
FIG. 9 is a schematic perspective view illustrating an exemplary arrangement of an emitter region in the semiconductor device according to one embodiment.
Figure 10:
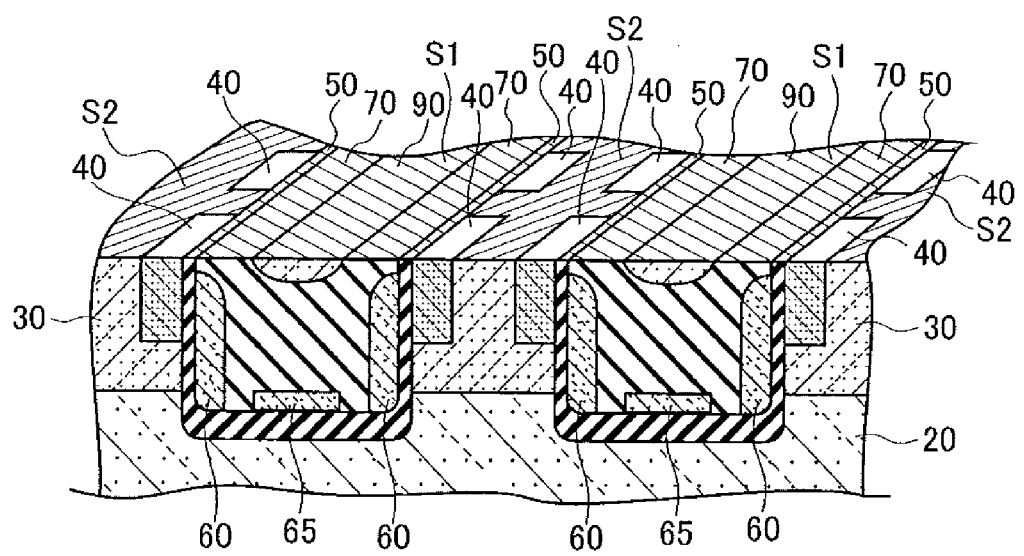
FIG. 10 is a schematic perspective view illustrating another exemplary arrangement of the emitter region in the semiconductor device according to one embodiment.

Emitter region 40 is arranged in a strip shape along the extending direction of groove 25 illustrated in FIG. 9. As illustrated in the perspective view in FIG. 10 schematically illustrating the structure of semiconductor device 1 in FIG. 1, emitter region 40 may be intermittently arranged on the top of base region 30 along the groove 25 but not in a strip shape along groove 25.

Figure 11:
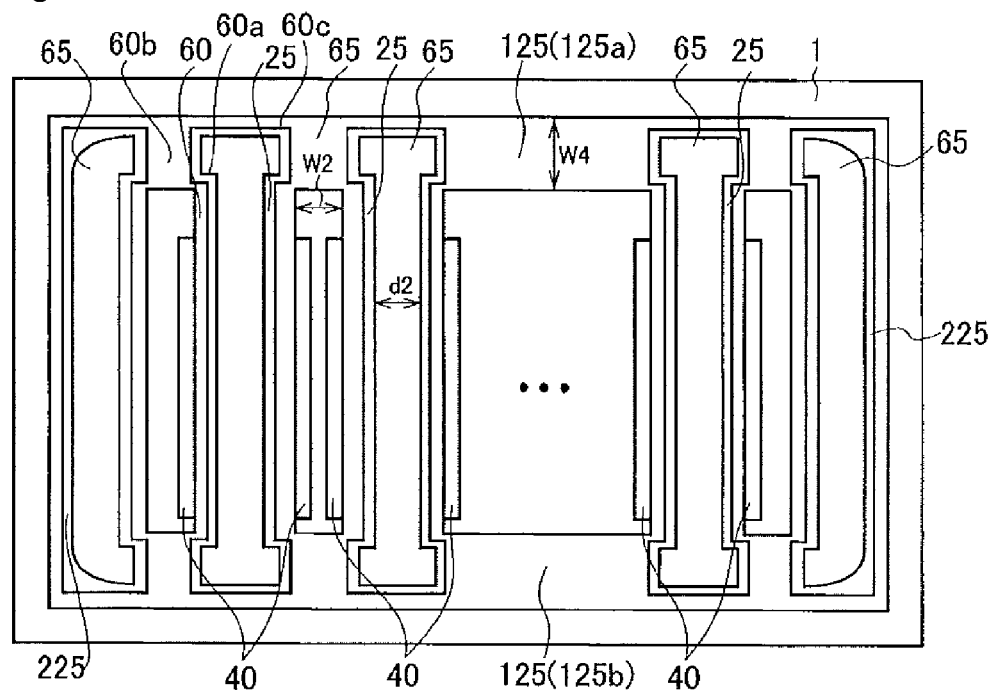
FIG. 11 is a schematic plan view illustrating an exemplary arrangement of a groove and a connection groove in the semiconductor device according to one embodiment.
Figure 12:
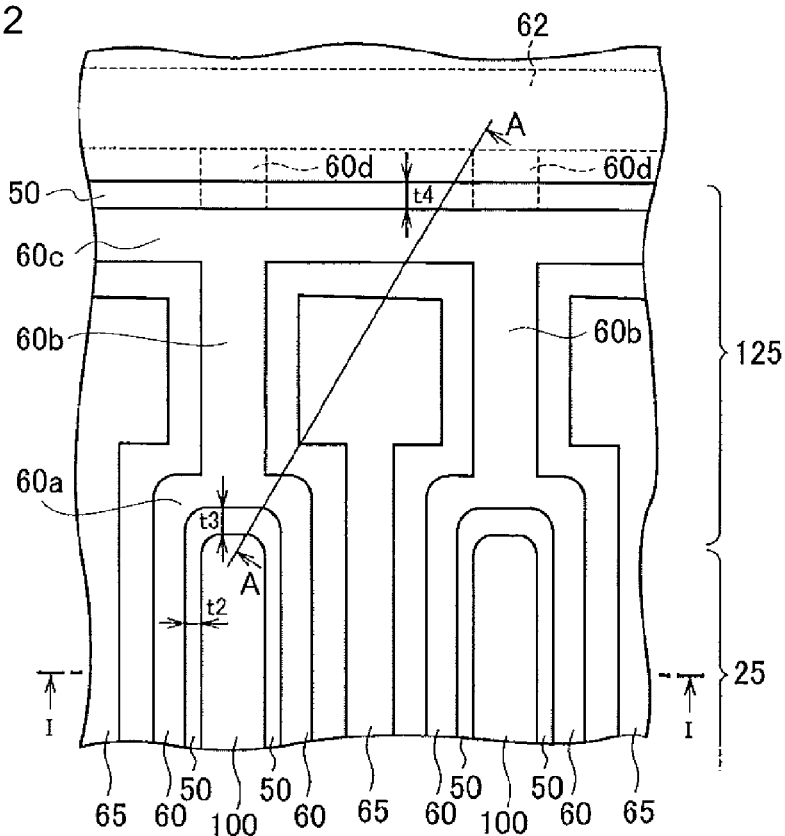
FIG. 12 is a schematic plan view illustrating a structure of the connection portion of the groove and the connection groove in the semiconductor device according to one embodiment.
Figure 13:
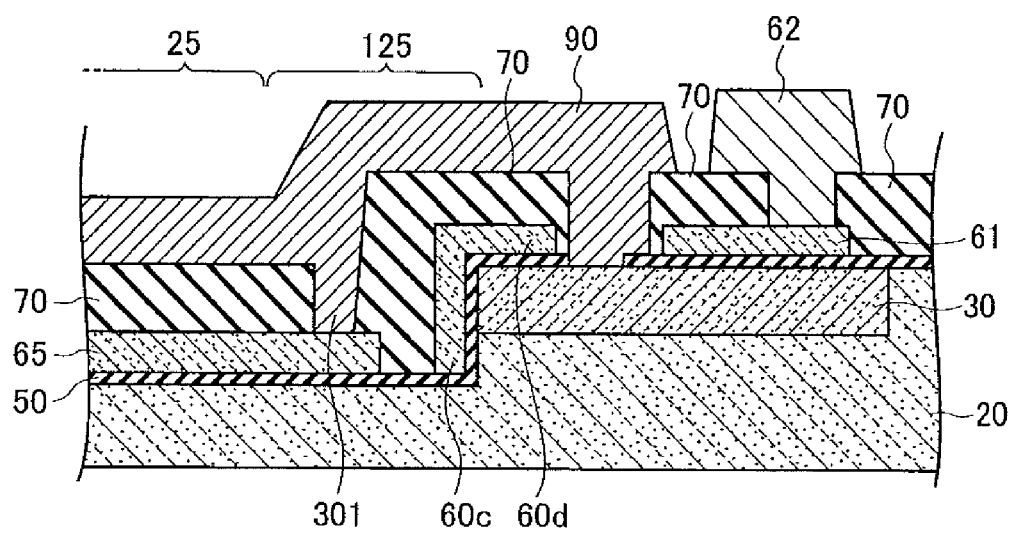
FIG. 13 is a schematic sectional view illustrating the connection portion in the groove extending direction of the semiconductor device according to one embodiment illustrated in FIG. 12.
Figure 16:
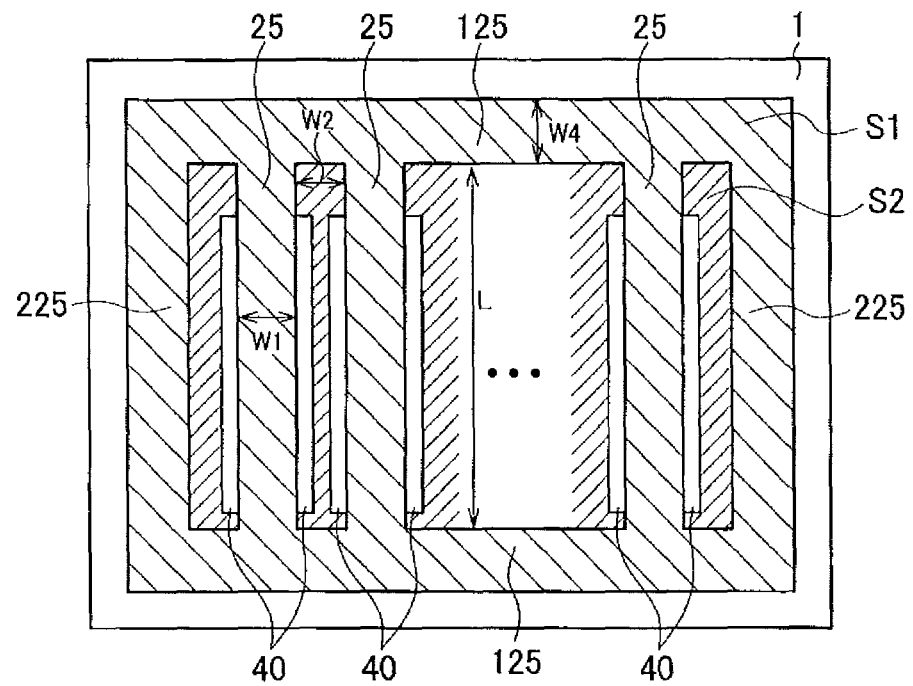
FIG. 16 is a schematic plan view illustrating an exemplary arrangement of the groove and the connection groove in the semiconductor device according to one embodiment.

FIG. 11 illustrates a plan view of semiconductor device 1. As illustrated in FIG. 11, a pair of left and right outer grooves 225 are arranged outside grooves 25 while extending along grooves 25. Both ends of adjacent grooves 25 are connected to each other by connection groove 125, and both ends of outer grooves 225 are also connected by connection groove 125. The outermost outer groove 225 can also be called connection groove 125. FIG. 12 illustrates an enlarged plan view of the connection portion between connection groove 125 and groove 25. FIG. 13 illustrates a schematic sectional view of the connection portion of the semiconductor device illustrated in FIG. 12 taken along the extending direction of the groove with respect to bottom electrode 65. FIG. 16 illustrates a plan view illustrating the relationship among groove 25, connection groove 125, and outer groove 225 in which gate electrode 60 and bottom electrode 65 in the plan view of FIG. 11 are omitted. In FIGS. 11 and 12, interlayer insulation film 70 and emitter electrode 90 are not illustrated. FIG. 1 is a sectional view taken along the I-I direction of FIG. 12.

As illustrated in FIGS. 11 and 16, grooves 25 are arranged side by side, each groove having a length (L) in the extending direction of groove 25 being equal to or longer than the width (W1) of groove 25. On the outermost sides of a group of grooves 25 in the paper of FIG. 11, at least one groove (outer groove) 225 is arranged parallel to the extending direction of groove 25. The pair of left and right outer grooves 225 are formed the top surface of base region 30 to drift region 20. Emitter region 40 on base region 30 is not arranged on the outer peripheral side walls of outer grooves 225 of semiconductor substrate 100.

The structure inside outer groove 225 will be described in more detail. Looking at the cross section of semiconductor device 1 in the widthwise direction of outer groove 225, similarly to gate electrode 60 inside groove 25, left and right gate electrodes 60 are arranged opposite to base region 30 on insulation film 50, which is arranged on outer peripheral side walls of a pair of left and right outer grooves 225 of semiconductor substrate 100 and inner peripheral side walls facing the outer peripheral side walls, respectively. Similarly to bottom electrode 65 inside groove 25, bottom electrode 65 is arranged opposite to drift region 20 on insulation film 50 arranged on the bottom surface of each outer groove 225 and extends from the outer peripheral side wall of outer groove 225 of semiconductor substrate 100 toward the inner peripheral side walls of outer grooves 225 of semiconductor substrate 100. Bottom electrode 65 is spaced from left and right gate electrodes 60 inside outer groove 225, and is electrically separated from left and right gate electrodes 60 inside outer groove 225. Specifically, interlayer insulation film 70 is arranged between bottom electrode 65 and left and right gate electrodes 60 inside outer groove 225 to electrically insulate bottom electrode 65 from left and right gate electrodes 60.

Connection groove 125 will be described in more detail. As illustrated in FIG. 16, connection groove 125 includes first connection groove 125a extending in the arrangement direction of grooves 25 and connecting one ends of adjacent grooves 25 and outer grooves 225 to each other and second connection groove 125b extending in the arrangement direction of grooves 25 and connecting the other ends of adjacent grooves 25 and outer grooves 225 to each other. Namely, grooves 25 and outer grooves 225 are arranged in a region in which a pair of connection grooves (125a and 125b) are opposite to each other. Connection groove 125 is referred to as connection grooves 125a and 125b only if connection grooves 125a and 125b should be distinguished from each other.

Figure 17:
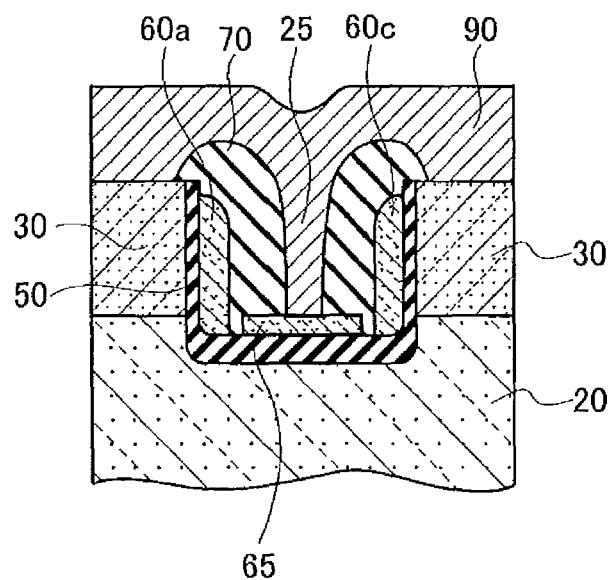
FIG. 17 is a schematic sectional view illustrating the connection portion in the A-A direction of the semiconductor device according to one embodiment illustrated in FIG. 12.

FIG. 17 illustrates a sectional view of semiconductor device 1 including connection groove 125. As illustrated in FIG. 17, connection groove 125 is formed from the top surface of base region 30 to drift region 20. The side walls of connection groove 125 have no emitter region 40 on base region 30. Accordingly, the internal region surrounded by outer grooves 225 and connection groove 125 defines the IGBT active region for operation while the external region surrounded by outer grooves 225 and connection groove 125 functions as the outer peripheral region surrounding the active region. Although only three grooves 25 are illustrated in FIGS. 11 and 16, these drawings are schematically illustrated, and actually, a larger number of grooves 25 are arranged side by side.

As illustrated in the plan view of semiconductor device in FIG. 11, bottom electrodes (body of bottom electrode) 65 arranged in groove 25 and outer grooves 225 extend in the strip shape on insulation film 50 along the bottom surfaces of grooves 25 and outer grooves 225, respectively. As illustrated in FIG. 13, bottom electrode 65 extends on insulation film 50 on the bottom surface of connection groove 125. Bottom electrode 65 may have a fixed width, or a first region having a small width and a second region having a large width may be alternated in the length direction of groove 25 and outer grooves 225. If such regions having different widths are present as bottom electrode 65s, the average width of these regions is defined as the width of bottom electrode 65.

The ends of bottom electrodes 65 reside in connection groove 125. The end of bottom electrode 65 is connected to connection portion 301 to the bottom electrode. As illustrated in FIG. 13, connection portion 301 to the bottom electrode connects the end of bottom electrode 65 to emitter electrode 90. Connection portion 301 to the bottom electrode is arranged in the depth direction of connection groove 125 penetrating through interlayer insulation film 70 arranged on bottom electrode 65 over groove 25 and outer grooves 225 and connection groove 125. Accordingly, the dimension of connection portion 301 for the bottom electrode (dimension in the depth direction of connection groove 125) is larger than the thickness of bottom electrode 65 (dimension in the depth direction of connection groove 125). As illustrated semiconductor device 1 in FIGS. 11 and 12 in plan view, the width of the end of bottom electrode 65 in connection groove 125 is larger than the width of bottom electrode 65 arranged in groove 25. This configuration enables preferable connection between bottom electrode 65 and connection portion 301 to the bottom electrode.

Interlayer insulation film 70 is formed in connection groove 125 as follows: interlayer insulation film 70 is laminated in connection groove 125, and is annealed; and openings are formed in interlayer insulation film 70, and connection portions 301 to the bottom electrodes are arranged in the openings. At this time, because as illustrated in FIG. 17, connection groove 125 has a width larger than that of groove 25, interlayer insulation film 70 is relatively thin and has a flat top surface in the central portion of connection groove 125. The openings are formed in interlayer insulation film 70, and connection portions 301 to the bottom electrodes are arranged in the openings to readily form the openings of interlayer insulation film 70 and connection portions 301 to the bottom electrodes. In addition, connection portions 301 can attain preferable connection to bottom electrodes 65.

Connection between gate electrode 60 and a gate bus line will now be described. As illustrated in the plan view of the semiconductor device in FIG. 11, gate electrodes 60 in grooves 25 and outer grooves 225 extend along the side walls of grooves 25 and outer grooves 225, respectively, to the connection grooves (125a and 125b) of the ends of gate electrodes 60. The ends of gate electrodes 60 are connected to a gate connection portion in connection groove 125 to be connected to gate bus line 62.

As illustrated in FIGS. 11 and 12, the gate connection portion includes first portion 60a, second portion 60b, and third portion 60c arranged on insulation film 50 on the outer side surface of connection groove 125.

First portion 60a of the gate connection portion is arranged on the inner side surface of connection groove 125 on insulation film 50. First portion 60a of the gate connection portion extends in the length direction of connection groove 125 to connect adjacent gate electrodes 60. Second portion 60b of the gate connection portion is arranged on insulation film 50 on the bottom surface of connection groove 125. Second portion 60b of the gate connection portion extends in the widthwise direction of connection groove 125 to be connected to one end of first portion 60a of the gate connection portion in the bottom. As illustrated in FIGS. 11 and 12, second portion 60b of the gate connection portion extends across the end of bottom electrode 65. The dimension of second portion 60b of the gate connection portion (dimension in the depth direction of groove 25) is substantially the same as the thickness of bottom electrode 65 and is smaller than the dimension of gate electrode 60 (dimension in the depth direction of groove 25).

Third portion 60c of the gate connection portion is arranged on insulation film 50 on the outer side surface of connection groove 125. Third portion 60c of the gate connection portion is arranged on insulation film 50 on the outer side surface of connection groove 125. Third portion 60c of the gate connection portion extends in the depth direction of connection groove 125 upward in the semiconductor substrate to be connected to the other end of second portion 60b of the gate connection portion.

Fourth portion 60d of the gate connection portion is arranged on insulation film 50 on semiconductor substrate 100 to connect third portion 60c of the gate connection portion to gate bus line 62.

Although not illustrated, a variety of enhanced breakdown voltage structures can be arranged in the outer peripheral region on the outer side of bus line 62. For example, a reduced surface field (RESURF) or a field limiting ring (FLR) is arranged in the outer peripheral region.

The operation of semiconductor device 1 illustrated in FIG. 1 will now be described.

A predetermined collector voltage is applied across emitter electrode 90 and collector electrode 80, and a predetermined gate voltage is applied across emitter electrode 90 and gate electrode 60. For example, the collector voltage is about 300 to 1600 V and the gate voltage is about 10 to 20 V. If semiconductor device 1 is turned on in this state, channel region 101 is reversed from the p-type to the n-type to form a channel. Electrons from emitter region 40 are injected into drift region 20 via the formed channel. These injected electrons positively bias collector region 10 and drift region 20 so that holes move from collector region 10 through drift region 20 to base region 30. As the current is increased, holes from collector region 10 are increased and are accumulated in the lower portion of base region 30. As a result, on-voltage is reduced by conductivity modulation.

If semiconductor device 1 is turned off, the gate voltage is reduced from the threshold voltage, for example, the gate voltage is controlled to have the same potential as the emitter voltage or have a negative potential to eliminate channel region 101. The elimination of the channel region terminates the injection of electrons from emitter region 40 to drift region 20. Since the potential of collector electrode 80 is higher than that of emitter electrode 90, a depletion layer expands from the interface between base region 30 and drift region 20. The holes accumulated in drift region 20 are discharged to emitter electrode 90 via base region 30 formed between adjacent grooves 25. Namely, the contact portion between base region 30 and emitter electrode 90 between grooves 25 functions as a suction port of holes.

Figure 2:
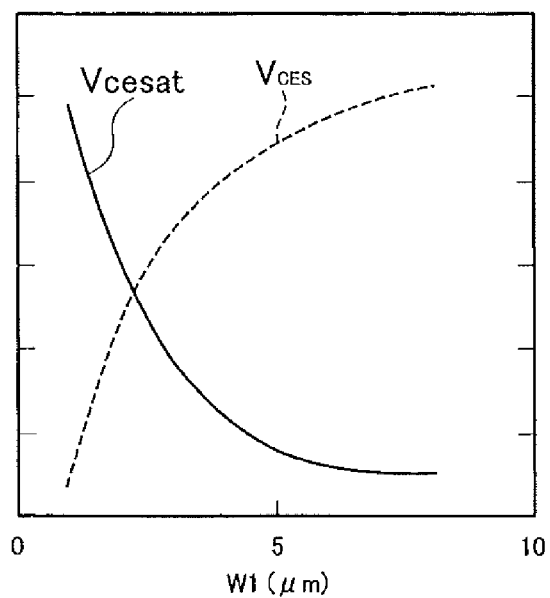
FIG. 2 is a graph illustrating the relationship between the width of a groove, the collector-emitter voltage, and the collector-emitter saturation voltage of the semiconductor device according to one embodiment.

FIG. 2 illustrates the relationship between width W1 of groove 25 of semiconductor device 1, collector-emitter voltage VCES during short circuit between the gate and the emitter, and collector-emitter saturation voltage $V_{cesat}$. Collector-emitter saturation voltage $V_{cesat}$ corresponds to the on-voltage. Gap W2 between grooves 25 and the width of the connection region are fixed. A lower collector-emitter saturation voltage $V_{cesat}$ is preferred and a larger collector-emitter voltage VCES is preferred. FIG. 2 shows that an increase in width W1 of groove 25 reduces the on-voltage. This is explained for the following reason.

A predetermined collector voltage is applied across emitter electrode 90 and collector electrode 80 and a predetermined gate voltage is applied across emitter electrode 90 and gate electrode 60 to turn semiconductor device 1 on. Channel formation region 101 is then reversed from the p-type to the n-type to form a channel. The electrons mainly move via the formed channel from emitter electrode 90 along the side surface of groove 25, and are injected into drift region 20. Collector region 10 and drift region 20 are positively biased by the injected electrons so that holes move from collector region 10 to drift region 20.

The holes moved from collector region 10 are prevented by the bottom portion of groove 25 from further moving, and are accumulated in the lower portion of groove 25. In semiconductor device 1 illustrated in FIG. 1, a larger width W1 of groove 25 can accumulate a larger amount of holes in the lower portion of groove 25. Accordingly, as illustrated in FIGS. 9 and 10, area S1 of groove 25 in semiconductor device in plan view is desirably larger than the area of a semiconductor region between grooves 25. A larger area S1 of groove 25 can accumulate a larger amount of holes in the lower portion of groove 25 in plan view. The thickness of drift region 20 in the lower bottom portion of groove 25 is sufficiently larger than width W1 of groove 25, at least 30 µm to 40 µm or more. Not only the interface between collector region 10 extended from the channel and drift region 20 but also the interface between collector region 10 and drift region 20 larger than that are positively biased, so that holes can readily move from collector region 10 to drift region 20.

As a result, the amount of holes accumulated is increased not only in the lower portion of groove 25 but also in the vicinity thereof and in drift region 20 below base region 30 on the outer side of groove 25. Thus the total amount of holes accumulated in drift region 20 is increased to more significantly enhance conductivity modulation and reduce the on-voltage of semiconductor device 1.

The movement of holes is also prevented in connection groove 125 and outer groove 225 in the same manner as in groove 25, so that holes are accumulated not only in the lower portions of connection grooves 125 and outer grooves 225 but also in the vicinity of the inner peripheral side walls of connection grooves 125 and outer grooves 225 and in drift region 20 below base region 30 on the inner side of these grooves. As a result, the on-voltage of semiconductor device 1 is more significantly reduced by connection grooves 125 and outer grooves 225. As illustrated in FIG. 16, at least one groove of connection groove 225 and outer groove 225 is formed to have width W4 larger than gap W2 between grooves 25. Thereby, holes are relatively readily accumulated not only in the lower portions of connection grooves 125 but also in the vicinity of inner peripheral side walls of connection grooves 125 and outer grooves 225 and in drift region 20 below base region 30 on the inner side of these grooves. As a result, the on-voltage can be remarkably reduced.

Unfortunately, if width W4 of at least one groove of connection groove 125 and outer groove 225 is larger than gap W2 between grooves 25, holes are readily accumulated in the lower portion of base region 30 arranged on the outer peripheral side wall of outer groove 225 readily causing latch-up. Latch-up reduces the reliability of the device. Accordingly, the relationship between width W4 of the groove and width W1 of the groove should be determined from the viewpoint of a reduction in on-voltage and prevention of latch-up. In short, to prevent latch-up, desirably width W4 of the groove is not larger than width W1 of the groove. As illustrated in FIG. 13, if base region 30 is arranged on the outer side of connection groove 125 and is connected to emitter electrode 90, the holes accumulated in the lower portion of base region 30 can be discharged via base region 30 to emitter electrode 90. As a result, latch-up can be prevented.

Connection groove 125 arranged intersecting the extending direction of groove 25 can attain an incidental effect of improving an inner stress balance in a plane of a chip.

An effect of reducing the movement of holes to emitter electrode 90 by a reduction in width W3 of the connection region in semiconductor device 1 will now be described.

The connection region of base region 30 having width W3 and being in contact with emitter electrode 90 serves as a port for holes to move from base region 30 to emitter electrode 90. Since width W3 is sufficiently smaller than width W1 (about ½ times to 1/12 times width W1), the amount of holes moving to emitter electrode 90 can be reduced, so that holes are accumulated in drift region 20 near the bottom portion of groove 25. Width W3 is sufficiently narrower than width W1. This indicates that in FIGS. 9 and 10, region S2 of base region 30 facing emitter electrode 90 is sufficiently narrower than area 51 of groove 25. Accordingly, the effect of accumulating holes can be attained by area 51 of groove 25 and an effect of preventing holes from moving to emitter electrode 90 can be attained by a reduction in area S2 facing emitter electrode 90. These synergistic effects attain semiconductor device 1 having significantly enhanced conductivity modulation and sufficiently reduced on-voltage.

Figure 5:
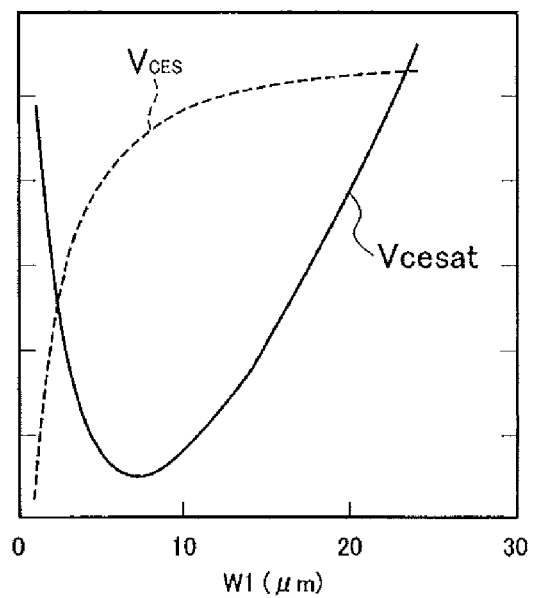
FIG. 5 is another graph illustrating the relationship between the width of the groove, the collector-emitter voltage, and the collector-emitter saturation voltage of a semiconductor device according to one embodiment.

An increase in the chip area is limited by cost and the production process. In the chip having a fixed size, an increase in width W1 of groove 25 reduces the number of channels. As a result, as illustrated in FIG. 5, the effect of reducing the on-voltage by conductivity modulation caused by accumulation of holes is reduced as the effect of increasing the on-voltage by a reduction in the number of channels is increased, so that the on-voltage of the semiconductor device is increased. Consequently, W1 is preferably about 3 µm to 20 µm. FIG. 5 shows that groove 25 having width W1 of about 7 µm reduces the on-voltage most effectively. In typical semiconductor devices, groove 25 has width W1 of about 1 µm to 2 µm at most.

As described above, in semiconductor device 1, widths W1 of groove 25, connection groove 125, and outer grooves 225 (or areas of groove 25, connection groove 125, and outer grooves 225) can be increased to attain the effect of accumulating holes, and width W3 of the connection region (or area of region S2 of base region 30 facing emitter electrode 90 in plan view) can be reduced to attain the effect of reducing the movement of holes to emitter electrode 90. These synergistic effects attain semiconductor device 1 having significantly enhanced conductivity modulation and sufficiently reduced on-voltage. As a result, semiconductor device 1 according to the present embodiment can reduce the on-voltage without using any structure having a carrier accumulation layer, for example.

Figure 3A:
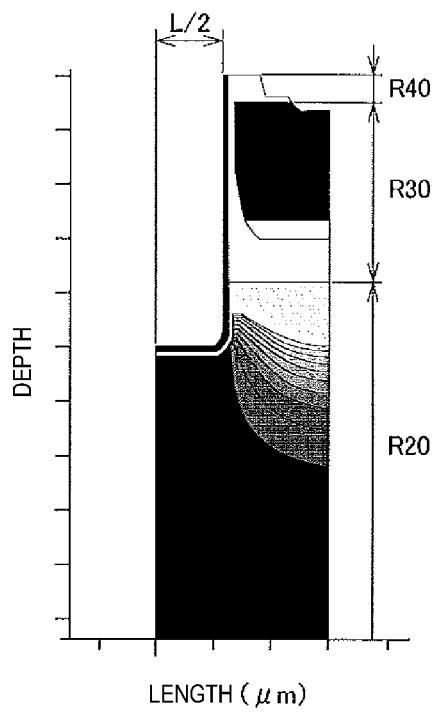
FIGS. 3A and 3B illustrate the results of simulation of holes accumulated in a semiconductor device.
Figure 3B:
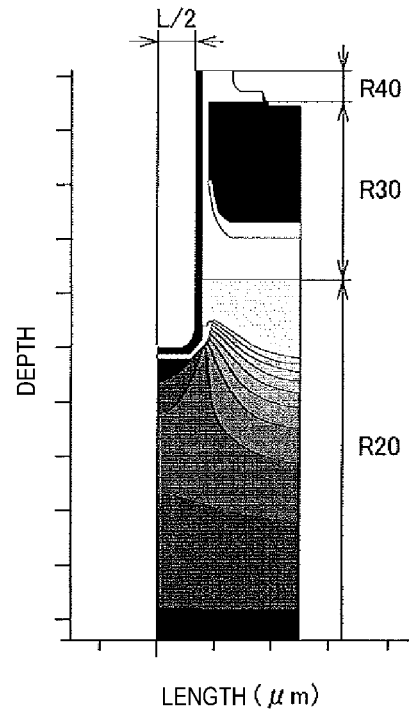

FIG. 3A illustrates the results of simulation of accumulation of holes. For reference, FIG. 3B illustrates the results of simulation in which the width of groove 25 is narrower than that in FIG. 3A. FIG. 3B illustrates the results of simulation in which the width of groove 25 is a half of width W1 of groove 25 in FIG. 3A. In FIGS. 3A and 3B, the abscissa indicates the width of groove 25, and the ordinate indicates the depth from the surface of groove 25 (depth of the opening). Region R20 corresponds to drift region 20, region R30 base region 30, and region R40 emitter region 40. A region of a darker color indicates a higher density of accumulated holes. Namely, the results of simulation show that a larger amount of holes is accumulated in FIG. 3A than in FIG. 3B not only in the lower portion of groove 25 but also in the vicinity of thereof and in drift region 20 below base region 30 on the outer side of groove 25.

In particular, semiconductor device 1 illustrated in FIG. 1, bottom electrode 65 is electrically connected to emitter electrode 90 and has a fixed emitter potential. Accordingly, holes are readily drawn toward bottom electrode 65 to be accumulated in the bottom of groove 25. For this reason, a large amount of holes is accumulated not only in the lower portion of groove 25 but also in the vicinity thereof and in drift region 20 below base region 30 on the outer side thereof. Accordingly, semiconductor device 1 can have enhanced conductivity modulation to reduce the on-voltage.

Next, the mechanism to effectively accumulate holes by bottom electrode 65 will now be described.

As illustrated in FIGS. 1 and 11, in each of groove 25 and outer groove 225, bottom electrode 65 extends in a strip shape in the extending direction of groove 25 or outer groove 225, and reaches connection groove 125. Looking at the whole semiconductor device 1 in plan view, the proportion of gap W2 between grooves 25 to width d2 of bottom electrode 65 is ¼ or more, and preferably width d2 of bottom electrode 65 > gap W2 between grooves 25. Moreover, width d2 (or area S3) of bottom electrode 65 is 70% or more of the width W1 of groove 25 (or area S1). Accordingly, bottom electrode 65 are arranged substantially all over the active regions of grooves 25.

Bottom electrode 65 electrically connected to emitter electrode 90 has a remarkable effect to draw holes to drift region 20 below each of grooves 25 and outer grooves 225 below bottom electrode 65 to keep the holes there. This effect can enhance the conductivity modulation of semiconductor device 1 to reduce the on-voltage more significantly.

As illustrated in FIG. 2, an increase in the width W1 of groove 25 can increase the breakdown voltage of semiconductor device 1. This is explained by the following reason.

If semiconductor device 1 is turned off, a depletion layer expands not only from the interface of PN junction formed between base region 30 and drift region 20 but also from the bottom portions of grooves 25 and their surrounding areas into drift region 20. At this time, the depletion layer preferably expands homogeneously in a wider region. Uneven or narrow expansion of the depletion layer reduces breakdown voltage. For example, in the bottom surface of groove 25, an electric field is concentrated on both sides of groove 25 in the widthwise direction. In a narrow width W1 of groove 25, both sides of groove 25 on the bottom surface of groove 25 are close to each other in the widthwise direction. For this reason, the depletion layer does not expand homogeneously in a wider range under the bottom surfaces of grooves 25. In contrast, as the bottom portion of groove 25 has larger width W1, a distance between the two sides of the bottom surface of groove 25 becomes larger. For this reason, the depletion layer under the bottom portions of grooves 25 expands more homogeneously or more widely. For this reason, semiconductor device 1 having large width W1 of groove 25 has enhanced breakdown voltage.

Figure 4A:
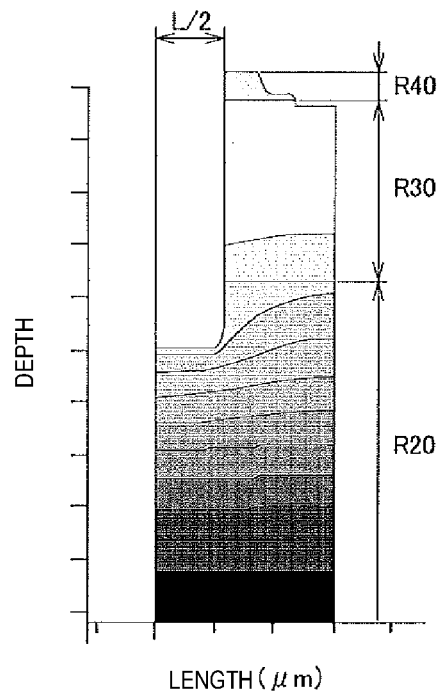
FIGS. 4A and 4B illustrate the results of simulation of potential distribution around the groove.
Figure 4B:
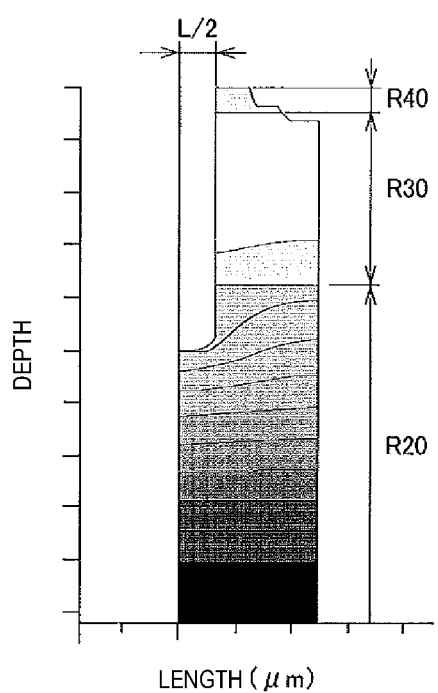

FIGS. 4A and 4B illustrate the results of simulation of potential distribution. In FIG. 4B, width W1 of groove 25 is a half of that in FIG. 4A. In FIGS. 4A and 4B, the ordinate indicates the depth of groove 25. Region R20 corresponds to drift region 20, region R30 base region 30, and region R40 emitter region 40. A darker portion indicates a region having high potential. FIGS. 4A and 4B show that a depletion layer expands under grooves 25. In particular, it is confirmed that larger width W1 of groove 25 attains wider and flatter potential distribution under grooves 25 and reduces the concentration of the electric field.

Moreover, relatively narrow gap W2 enhances the breakdown voltage of semiconductor device 1. The depth of the depletion layer between grooves 25 is shorter than the depth of the depletion layer under groove 25. Large gap W2 of groove 25 results in a flatter depletion layer expanding from the PN junction between drift region 20 and base region 30 in the regions of grooves 25 into drift region 20. Such a flat depletion layer has distortion in the portion continuously ranging from the sides of groove 25 toward the depletion layer. This distortion reduces the breakdown voltage of semiconductor device 1. Accordingly, gap W2 is preferably narrow to some extent, and is desirably equal to or less than width W1 of groove 25.

Gap W2 equal to or less than width W1 of groove 25 indicates that the total of areas S1 of grooves 25 is larger than the total area of the semiconductor regions between grooves 25 in plan view. Grooves 25 are formed across the active region, which can attain a depletion layer having a mild slope in the active region to enhance breakdown voltage.

The extending portions of bottom electrodes 65 and gate electrodes 60 in connection grooves 125 can function as field plates to expand the depletion layer from the interface between drift region 20 and connection groove 125 into drift region 20. Accordingly, semiconductor device 1 can attain a depletion layer having a mild slope toward the outer periphery of semiconductor substrate 100 to enhance the breakdown voltage of semiconductor device 1.

As illustrated in FIG. 1, insulation film 50 is preferably formed such that film thickness t1 of the region arranged on the bottom surface of groove 25 is larger than film thickness t2 of the region arranged on the side surface of groove 25 and facing base region 30. Such a configuration significantly stabilizes the breakdown voltage between the collector and the emitter to enhance reliability.

Figure 8A:
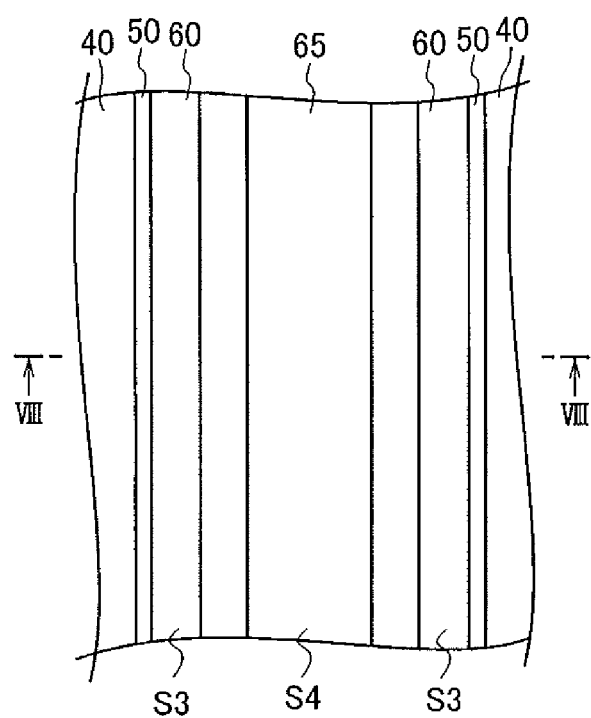
FIGS. 8A and 8B are schematic views illustrating the arrangement of a gate electrode, a bottom electrode, an insulation film, and an emitter region in the semiconductor device according to one embodiment.
Figure 8B:
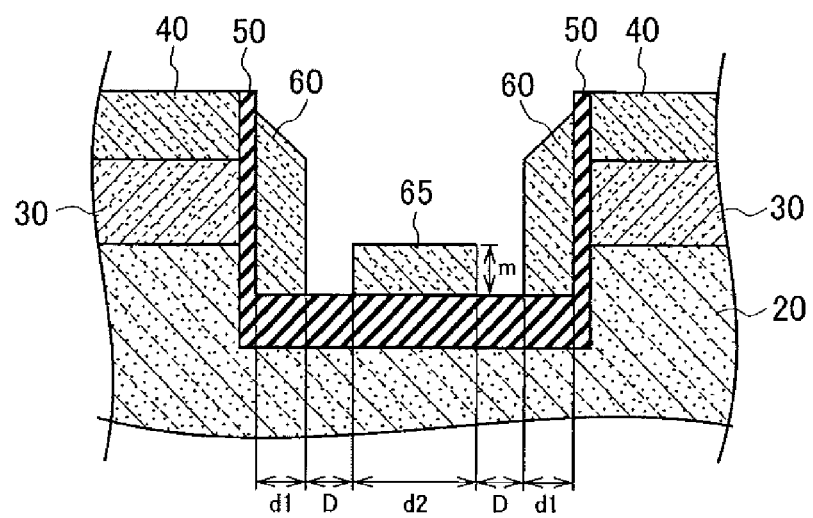

As illustrated in FIG. 8B, width d2 of bottom electrode 65 is preferably larger than gap D between bottom electrode 65 and gate electrode 60. Such a configuration of gate electrode 60 and bottom electrode 65 can preferably and smoothly expand the depletion layer from the interface between groove 25 and drift region 20. As a result, semiconductor device 1 attains enhanced breakdown voltage.

In plan view of semiconductor device 1 as illustrated in FIG. 12, grooves 25 have mildly curved corners in the connection portions between connection grooves 125 and grooves 25. Such a configuration can smoothly connect the depletion layer generated by gate electrode 60 arranged on the side surface of groove 25 and the depletion layer generated by first portion 60a, which is an extended portion of the gate electrode on the side surface of connection groove 125 to suppress a reduction in breakdown voltage. The film thicknesses (t3 and t4) of insulation film 50 arranged, as a gate insulation film, on the bottom and side surfaces of the connection groove may be made larger than the film thickness t2 of insulation film 50 arranged between groove 25 and gate electrode 60. Such a configuration attains the breakdown voltage of the outer peripheral region surrounding the active region higher than the breakdown voltage of the active region. As a result, breakdown readily occurs in the active region to prevent the concentration of the current, thus preventing breakage of semiconductor device 1.

An effect of reducing the capacitance of semiconductor device 1 will now be described. For formation of a channel, gate electrode 60 should extend to the bottom surface of groove 25. Gate electrode, if extending to the bottom surface of groove 25, generates stray capacitance Cdg between gate electrode 60 and drift region 20. To reduce this stray capacitance Cdg, the thickness of the gate electrode should be reduced or the thickness of insulation film 50 arranged on the bottom of groove 25 should be increased.

For example, as illustrated in FIG. 1, semiconductor device 1 has insulation film 50 having film thickness t1 under gate electrode larger than film thickness t2 on the side wall, thereby reducing stray capacitance Cdg. An increase in the whole film thickness of insulation film 50 leads to problems in threshold voltage. Namely, insulation film 50 on the side surface functions as a gate insulation film. If the film thickness of insulation film 50 on the side surface is increased, the threshold voltage increases. For this reason, in semiconductor device 1, the thickness of insulation film 50 is thin on the side surfaces and thick on the bottom surface. In such a configuration, stray capacitance Cdg can be reduced while a desired threshold voltage is maintained. Insulation film 50 arranged on the bottom surface of groove 25 has film thickness t1 of about 300 nm and that arranged on the side surfaces of groove 25 has film thickness t2 of about 150 nm, for example.

In semiconductor device 1, gate electrode 60 is formed only on the pair of facing side surfaces of groove 25, and gate electrode 60 are not formed in the central portion of groove 25 facing the bottom of groove 25. Such a configuration can reduce stray capacitance Cdg between drift region 20 on the bottom of groove 25 and gate electrode 60 to enable high-speed switching.

As illustrated in FIG. 8B, thickness width d1 of gate electrode 60 is about 1/20 to 1/3, more preferably about 1/15 to 1/5 of width W1 of groove 25. If thickness d1 of gate electrode 60 is less than 1/20 of width W1 of groove 25, gate electrode 60 is significantly thin to increase the resistance of gate electrode 60, leading to a reduction in switching response. Conversely, if thickness d1 of gate electrode 60 is more than 1/3 of width W1 of groove 25, the effect of reducing stray capacitance Cdg by separation of gate electrode 60 is not sufficiently attained.

Formation of groove 25 having a large width can reduce the number of grooves 25 per dimension of the chip and reduce the area of gate electrode 60 opposite to drift region 20 to reduce reverse transfer capacitance Crss. Such a reduction in the number of grooves 25 per dimension of the chip also can reduce the areas of base region 30 and emitter region 40 facing gate electrode 60 per dimension of the chip to reduce input capacitance Ciss (=Cgd+Cgs).

Bottom electrode 65 is electrically connected to emitter electrode 90. Formation of bottom electrode 65 does not contribute to an increase in stray capacitance Cdg. As illustrated in FIGS. 8A and 8B, width d2 of bottom electrode 65 is preferably larger than thickness d1 of gate electrode 60 in the region facing the bottom surface of groove 25. Such a configuration is preferred for the following reason.

Compared to semiconductor devices having gap W2 between grooves 25 as illustrated in FIG. 1, semiconductor device 1 having larger width W1 of groove 25 can effectively accumulate holes in the bottom of groove 25 having a large area. Such a semiconductor device can attain on-resistance reduced by conductivity modulation specific to IGBTs. If walls of wide grooves 25 as described above are completely covered with gate electrodes 60, reverse transfer capacitance Crss significantly increases. In contrast, in bottom electrode 65, width d2, which does not affect reverse transfer capacitance Crss, is larger than width d1 of gate electrode 60, for example, twice or more width W1. In plan view of semiconductor device 1 in FIG. 11, the area of bottom electrode 65 is larger than the area of gate electrode 60, for example, twice or more the area of gate electrode 60. Such a configuration can reduce a significant increase in reverse transfer capacitance Crss. In addition, the difference in potential between bottom electrode 65 and collector region 10 can expand the depletion layer from the bottom of groove 25 toward the semiconductor region to ensure a breakdown voltage substantially equal to that of a semiconductor device having the walls of groove 25 completely covered with gate electrode 60.

The top surface of bottom electrode 65 is desirably positioned at a level lower than emitter region 40, and bottom electrode 65 is outside of the region of the groove between emitter regions 40. The top surface of bottom electrode 65 is desirably positioned at a level substantially equal to or lower than the interface between base region 30 and drift region 20. Furthermore, width d2 of bottom electrode 65 is desirably larger than thickness m of bottom electrode 65 in the film thickness direction, for example, 1.5 times or more thickness m. Such a configuration can reduce the area of bottom electrode 65 facing gate electrode 60 to reduce stray capacitance Cgs. As a result, input capacitance Ciss can be further reduced.

A reduction in gate-emitter capacitance Cgs of semiconductor device 1 in the connection portion between bottom electrode 65 and emitter electrode 90 will now be described.

First, as illustrated in FIG. 13, at the end of bottom electrode 65 arranged in connection groove 125, bottom electrode 65 is connected to emitter electrode 90 on semiconductor substrate 100 via connection portion 301 to a bottom electrode, connection portion 301 extending in the depth direction of connection groove 125. Namely, the dimension of connection portion 301 to bottom electrode 65 (dimension of connection groove 125 in the depth direction) is larger than the thickness of bottom electrode 65 (dimension of connection groove 125 in the depth direction). Connection portion 301 to bottom electrode 65 is arranged only in connection groove 125. Such a configuration can reduce gate-emitter capacitance Cgs more significantly than in a configuration in plan view in which connection groove 301 is arranged to extend in a strip shape in groove 25 as an active region.

In addition, as illustrated in FIG. 11, second portion 60b of the gate connection portion faces the end of the bottom electrode to be connected to connection portion 301 to a bottom electrode. In semiconductor device 1, the dimension of second portion 60b of the gate connection portion (dimension of the connection groove 125 in the depth direction) is smaller than the dimension of gate electrode 60 (dimension in the depth direction of groove 25). In such a configuration, the area of second portion 60b of the gate connection portion facing connection portion 301 to a bottom electrode is smaller than that in the configuration in which gate electrode 60 faces connection portion 301 to a bottom electrode. Accordingly, semiconductor device 1 can reduce the stray capacitance generated between second portion 60b of gate connection portion and connection portion 301 to a bottom electrode.

(Production Method)

A method of producing semiconductor device 1 according to an embodiment of the invention will now be described with reference to FIGS. 6A to 6H and FIGS. 7I to 7N. Only a structure of one groove 25 will be illustrated. The following method of producing a semiconductor device to be described below is exemplary, and off course, the semiconductor device according to the embodiment of the invention can be implemented by a variety of production methods including the modifications of the method according to the embodiment of the invention.

Figure 6A:
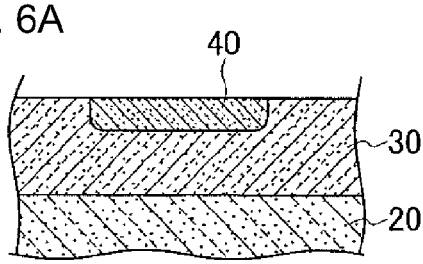
FIGS. 6A to 6H are sectional views illustrating steps in a method of manufacturing a semiconductor device according to one embodiment.

First, as illustrated in FIG. 6A, drift region 20 and base region 30 are sequentially formed on the surface of semiconductor substrate 100, and emitter region 40 is then formed on the surface of semiconductor substrate 100 (in base region 30) by ion implantation. At least one of base region 30 and emitter region 40 may be formed until or after formation of gate electrode 60 and bottom electrode 65 described later.

Figure 6B:
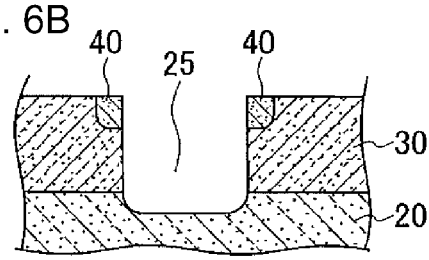

Next, as illustrated in FIG. 6B, groove 25 is formed in the region having emitter region 40 formed therein (groove formation step). Groove 25 can be formed by dry etching of semiconductor substrate 100 through a photoresist film as a mask, for example. Groove 25 penetrates through base region 30 to drift region 20.

Figure 6C:
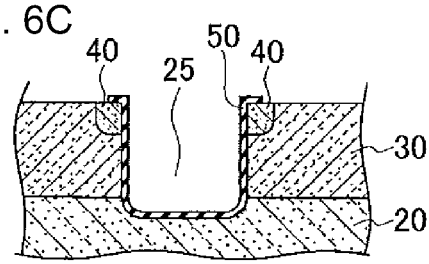

Next, insulation film 50 is formed over the surface of semiconductor substrate 100 including the inside of groove 25 by thermal oxidation (oxidation step). Subsequently, insulation film 50 arranged in the regions away from groove 25 is removed by etching. Insulation film 50 then remains only the inside of groove 25 (bottom surface and side surface) and its surrounding area as illustrated in FIG. 6C. If insulation film 50 has a uniform thickness inside groove 25, insulation film 50 can be formed through a single operation of thermal oxidation.

Figure 6D:
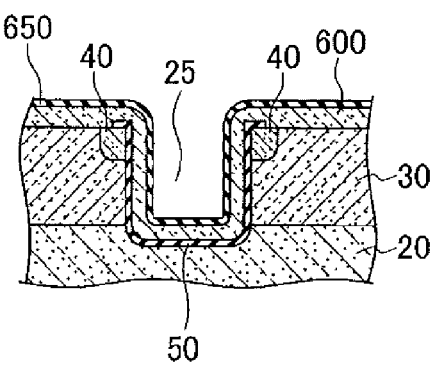

Next, a polycrystalline silicon film doped in a high concentration, e.g., E19 atom/cm$^3$ or more and 1E20 atom/cm$^3$ or less, (gate electrode material) 600 is formed by chemical vapor deposition (CVD) over the surface of the workpiece to give conductivity (gate electrode formation step). At this time, as illustrated in FIG. 6D, polycrystalline silicon film 600 is formed on the condition such that polycrystalline silicon film 600 has substantially a uniform thickness on the side surfaces and the bottom surface of groove 25 without completely filling groove 25 with polycrystalline silicon film 600. Sacrificial oxide film 650 is then formed on the surface of polycrystalline silicon film 600.

Figure 6E:
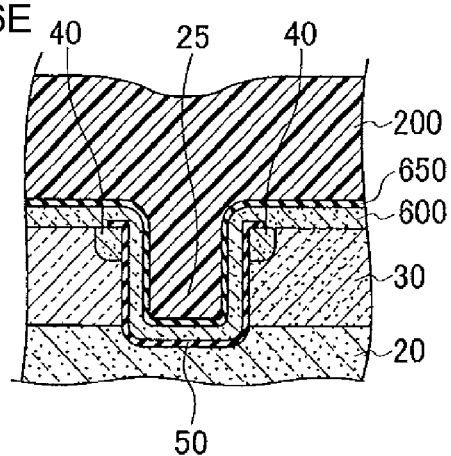
Figure 6F:
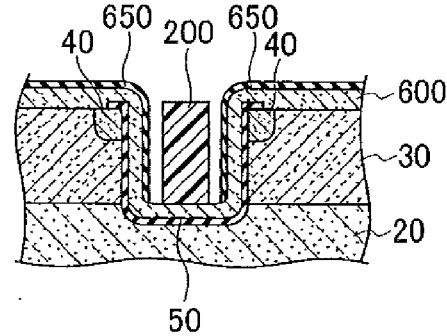

Next, polycrystalline silicon film 600 is formed (gate electrode patterning step). FIGS. 6E to 6H illustrate this step in detail. First, as illustrated in FIG. 6E, photoresist film 200 is formed over the workpiece by application, and is subjected to exposure to light and development through a mask to form photoresist film 200 as illustrated in FIG. 6F.

Figure 6G:
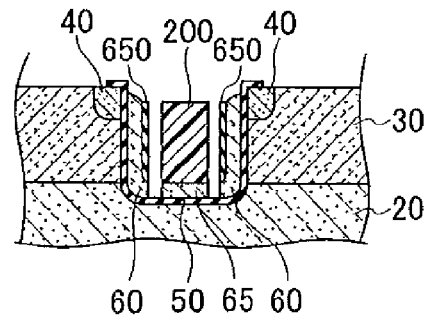
Figure 6H:
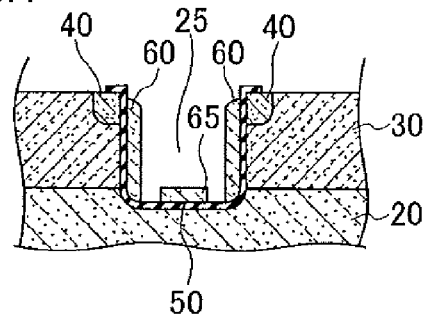

Subsequently, as in illustrated in FIG. 6G, polycrystalline silicon film 600 inside groove 25 in particular is selectively removed by dry etching (anisotropy etching) of polycrystalline silicon film 600 to form gate electrode 60 and bottom electrode 65 with gate electrode 60 and bottom electrode 65 being separated from each other. Subsequently, as in illustrated in FIG. 6H, sacrificial oxide film 650 and photoresist film 200 remaining on the side surfaces of gate electrode 60 and the top surface of bottom electrode 65 are removed. Gate electrode 60 and bottom electrode 65 are then formed. Polycrystalline silicon film 600 is also formed in the region not illustrated (such as at the end of groove 25 in the extending direction) to be partially left as a wiring material.

Figure 7I:
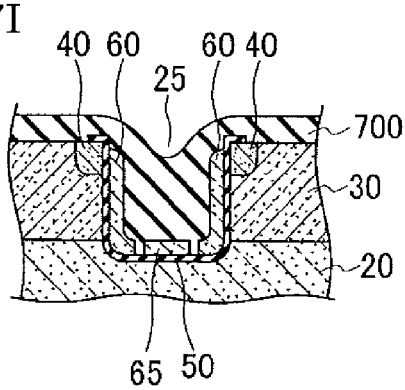
FIGS. 7I to 7N are sectional views illustrating steps in the method of manufacturing a semiconductor device according to one embodiment (continued).
Figure 7L:
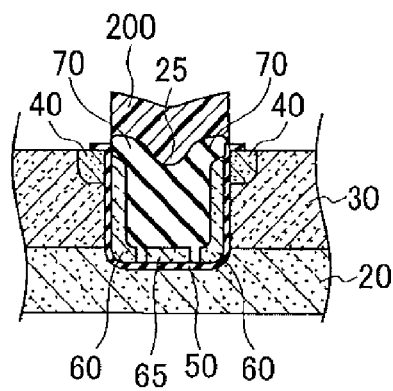

Subsequently, as illustrated in FIG. 7I, insulation film 700 is formed over the surface of the workpiece (interlayer insulation film formation step). At this time, insulation film 700 is formed inside groove 25 similarly to formation of polycrystalline silicon film 600.

Figure 7J:
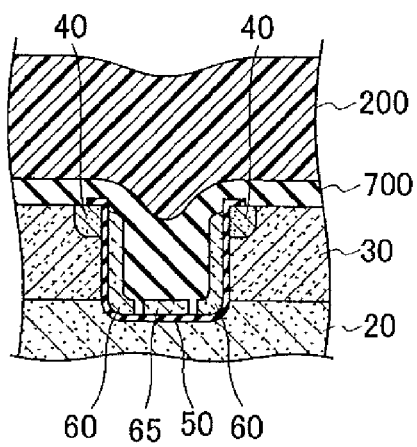
Figure 7M:
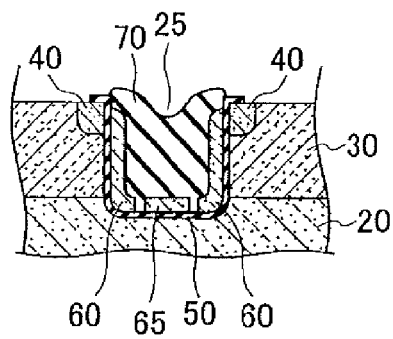
Figure 7K:
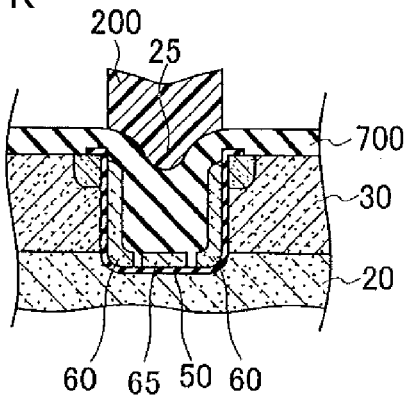

Next, formed insulation film 700 is formed (interlayer insulation film patterning step). FIGS. 7J to 7M illustrate this step in detail. First, as illustrated in FIG. 7J, photoresist film 200 is formed by application in the same manner as in FIG. 6D. Subsequently, as illustrated in FIG. 7K, photoresist film 200 is similarly formed such that insulation film 700 is exposed to the outside of groove 25.

A mask is placed on photoresist film 200, and insulation film 700 is dry etched. As illustrated in FIG. 7I, insulation film 700 then remains as interlayer insulation film 70. At this time, although not illustrated, insulation film 700 above bottom electrode 65 is removed by etching in the region where bottom electrode 65 is connected to emitter electrode 90. Subsequently, as illustrated in FIG. 7M, photoresist film 200 is removed, and the workpiece is annealed.

Figure 7N:
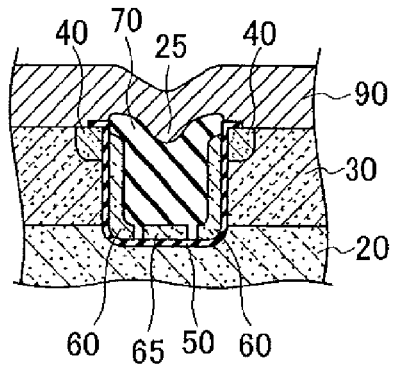

Subsequently, as illustrated in FIG. 7N, emitter electrode 90 is formed to form collector electrode 80 (not illustrated) on the back surface of semiconductor substrate 100. Semiconductor device 1 in FIG. 1 is thereby produced. Although emitter electrode 90 is formed over the surface of the region illustrated in FIG. 7N, emitter electrode 90 is not formed over the surface of semiconductor device 1. Actually, groove 25 extends in the direction orthogonal to the paper in FIGS. 6A to 6H and FIGS. 7I to 7N. At the end of the groove, gate electrode 60 is formed to be drawn from the surface of the semiconductor device without contacting emitter electrode 90. In such a configuration, gate electrode 60, emitter electrode 90, and collector electrode 80 each function as electrode terminals.

Gate electrode 60 and bottom electrode 65 can be simultaneously formed through formation of the same polycrystalline silicon film as described above can form.

The shape of the cross section of bottom electrode 65 (shape of etched polycrystalline silicon film 600 in FIG. 6G) can be controlled depending on the dry etching condition. For example, if bottom electrode 65 has a tapered shape (shape of bottom electrode 65 having the area of the bottom surface larger than that of the top surface), interlayer insulation film 70 can be readily embedded between gate electrode 60 and bottom electrode 65 to attain good insulation therebetween. Conversely if bottom electrode 65 has an inverted tapered shape (shape of bottom electrode 65 having the area of the top surface larger than that of the bottom surface), emitter electrode 90 and bottom electrode 65 can have a large contact area therebetween to reduce the contact resistance.

OTHER EMBODIMENTS

Although one embodiment according to the present invention has been described above, it should not be understood that the description and the drawing included as part of this disclosure are limitation to the invention. Various alternative embodiments, examples, and techniques for implementation will be apparent to persons skilled in the art.

Figure 15:
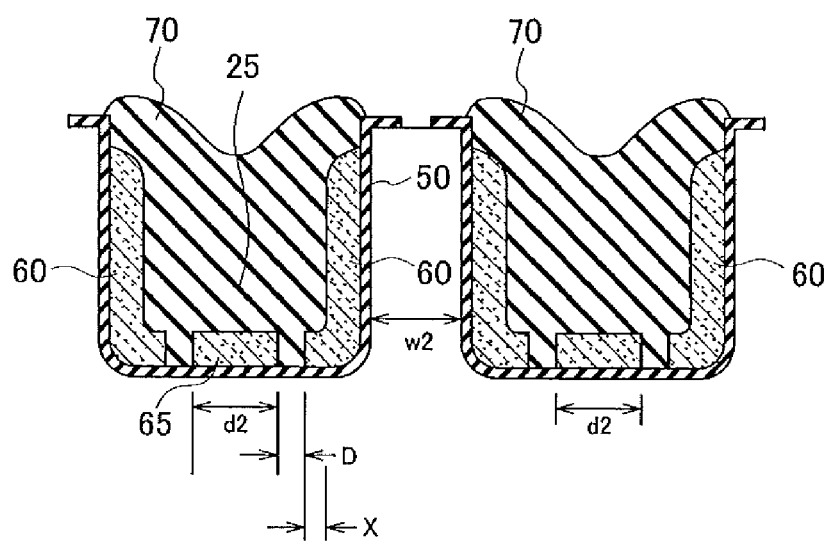
FIG. 15 is a diagram illustrating a modification example of the structure of the groove in the semiconductor device according to another embodiment.

For example, a modification of the structure of gate electrode 60 in semiconductor device 1 is illustrated in FIG. 15 in which the bottom portion of gate electrode 60 is projected toward the central portion of groove 25 across the bottom surface of groove 25. In FIG. 15, the gap between gate electrode 60 and bottom electrode 65 is expressed as D, and the amount of the bottom portion of gate electrode 60 projected toward bottom electrode 65 in groove 25 is expressed as X. In this modification, the sum of the projection amount X and width d2 of bottom electrode 65 is preferably larger than gap W2 between grooves 25. In such a configuration, holes relatively readily concentrate on the regions under gate electrode 60 and bottom electrode 65 and drift region 20 near gate electrode 60 and bottom electrode 65. Thereby further conductivity modulation specific to IGBTs can be generated to reduce on-resistance.

For example, larger gap D results in a reduction in the width of the depletion layer, which is formed under gate electrode 60, on the side of bottom electrode 65, reducing the breakdown voltage between emitter electrode 90 and collector electrode 80. For this reason, the breakdown voltage can be controlled by gap D between gate electrode 60 and bottom electrode 65.

A larger projection amount X of gate electrode 60 increases reverse transfer capacitance Crss. For this reason, reverse transfer capacitance Crss can be adjusted by projection amount X.

In the structure and the production method above, gap D and projection amount X can be determined by the mask patterns for photoresist film 200 and sacrificial oxide film 650 used in the gate electrode patterning step. For example, for protection of the semiconductor device, gap D and projection amount X can be determined such that the breakdown between emitter electrode 90 and collector electrode 80 occurs in a specific region of the chip. For example, a mask pattern having large gap D in this specific region can be used to readily reduce the breakdown voltage in the active region on the chip. In contrast, small gap D can reduce reverse transfer capacitance Crss. Namely, the distribution of the breakdown voltage or reverse transfer capacitance Crss in the plane of the chip can be controlled only by the mask pattern in lithography performed in the gate electrode patterning step. In lithography illustrated in FIG. 6F, light for exposure can be focused onto the bottom surface of groove 25 to control gap D and projection amount X with high precision.

As illustrated in FIG. 15, the ratio of the sum of width d2 of bottom electrode 65 inside groove 25 and projection amount X to gap W2 between grooves 25 is preferably about ¼ to 1¼. At a ratio of less than ¼, holes are barely accumulated in drift region 20. In contrast, at a ratio of more than 1¼, channel resistance increases, and in turn on-resistance does.

In addition, to enhance the effect of accumulating holes by bottom electrode 65 and groove 25, width d2 of bottom electrode 65, projection amount X and gap W2 between grooves 25 preferably satisfy the relationship expressed by the expression (d2+X)>W2. In particular, the relationship is preferred in semiconductor device 1 having high breakdown voltage.

Alternatively, emitter region 40 may be formed such that the first portion on the top surface side of semiconductor substrate 100 has an impurity concentration of 1E19 atom/cm$^3$ to 1E20 atom/cm$^3$ and the second portion arranged at a deeper level than the first portion has an impurity concentration of 1E18 atom/cm$^3$ to 1E19 atom/cm$^3$. Such a configuration can attain semiconductor device 1 having a high short-circuit capacity.

Semiconductor device 1 in FIG. 1 has groove 25 with a flat bottom. Groove 25 may be formed to have a bottom such that the central portion of groove 25 is shallower than the end of groove 25. Groove 25 having such a bottom can accumulate holes in the central portion of the bottom of groove 25 more efficiently. As a result, on-voltage can be reduced.

Alternatively, at least part of the bottom of groove 25 may have a curved surface projected downward. If the bottom of groove 25 has an end with a large curve, holes readily move to base region 30 without being accumulated under groove 25. For this reason, groove 25 having a large flat bottom or a large projection on the bottom can reduce on-voltage.

FIG. 13 illustrates a sectional view of the connection portion between groove 25 and connection groove 125. Emitter electrode 90 is connected to bottom electrode (bottom electrode body) 65 via connection portion 301 to bottom electrode 65, which is opening 301 arranged in interlayer insulation film 70. Connection portion 301 is arranged at the end in the extending direction of bottom electrode 65, and is located at or outside of the end of the region in which left and right gate electrodes 60 face each other. In short, connection portion 301 is arranged outside of the active region. For example, formation of connection portion 301 generates a narrow recess on the top surface of emitter electrode 90 above connection portion 301, which is arranged in the active region. Such a recess reduces the connection strength between emitter electrode 90 in the active region and the bonding wire. Accordingly, bottom electrode 65 is preferably connected to emitter electrode 90 only at the end of bottom electrode 65 spaced from the active region. Furthermore, formation of connection portion 301 may lead to unintentional invasion of moisture content into groove 25. The invasion of moisture content into the active region reduces reliability of the semiconductor device significantly. Connection portion 301 is preferably formed only at the end of bottom electrode 65, that is, in the outer peripheral region. As illustrated in FIG. 13, base region 30 may be formed to the outside region of connection groove 125. Such a configuration can ensure a region outside of connection groove 125 to surely contact base region 30 and emitter electrode 90.

Figure 14:
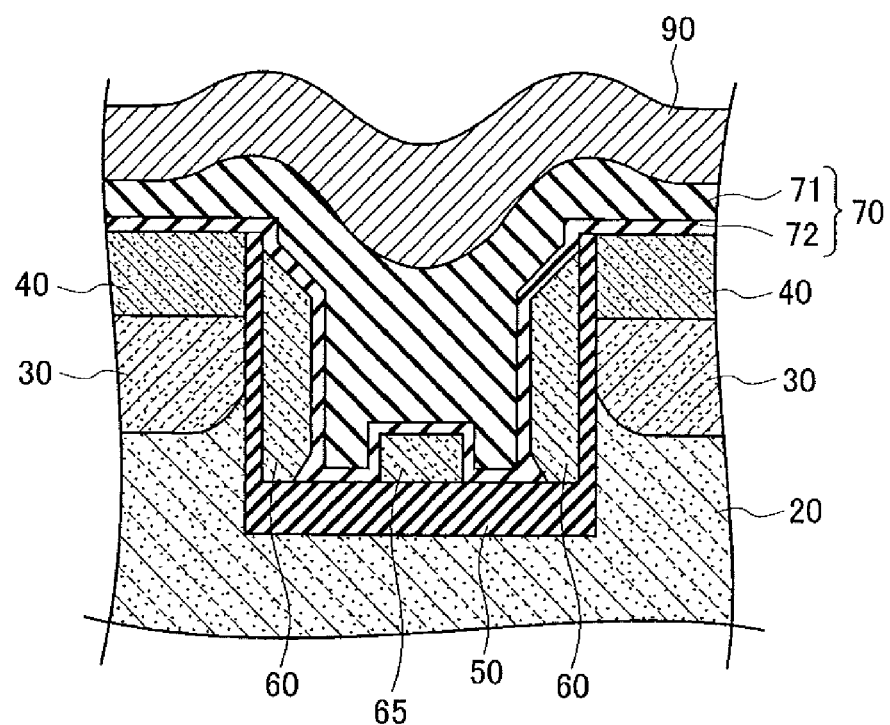
FIG. 14 is a schematic sectional view illustrating an exemplary structure of a semiconductor device according to another embodiment.

As illustrated in FIG. 14, the lower surface of gate electrode 60 facing the bottom surface of groove 25 may be tapered. Such a tapered lower surface of gate electrode 60 can reduce the area of the bottom surface of gate electrode 60 facing drift region 20 (collector region 10) to reduce stray capacitance Cdg.

Groove 25 is filled with part of interlayer insulation film 70. Accordingly, as illustrated in FIG. 14, interlayer insulation film 70 may be formed such that the film thickness is large above the end of opening of groove 25 and is small above the central portion of opening of groove 25. A large recess is generated above the central portion of opening of groove 25, and in turn on the top surface of emitter electrode 90. Such a configuration increases the connection area between emitter electrode 90 and clip lead or bonding wire arranged on the top surface of emitter electrode 90 to enhance connection strength.

If gate electrode 60 and bottom electrode 65 each are a polycrystalline silicon electrode containing a dopant, interlayer insulation film 70 preferably has a laminate structure of first insulation film 71 made of BPSG film and second insulation film 72 made of an NSG film as illustrated in FIG. 14, for example. The BPSG film is an interlayer film whose surface can be smoothed by annealing while phosphorus (P) contained in the BPSG film affects the conductivity of the electrode. For this reason, the NSG film containing no phosphorus, as a protective film, can be arranged between the electrode and the BPSG film to attain a smooth top surface of interlayer insulation film 70 without affecting the conductivity of the electrode.

As illustrated in FIG. 14, the interface between base region 30 and drift region 20 is located between grooves 25, and the interface between base region 30 and drift region 20 in a region spaced from groove 25 is located at a lower level than the interface between base region 30 and drift region 20 in the region adjoining the grooves 25 (e.g., closer to collector region 10). Such a configuration of the interface between base region 30 and drift region 20 increases a distance from the bottom of groove 25 to base region 30. In such a configuration, drift region 20 can accumulate a larger amount of holes. The effect of conductivity modulation can be promoted to reduce on-resistance more significantly.

An n-type semiconductor region having a higher impurity concentration than that of drift region 20 may be arranged between drift region 20 and base region 30. If such a semiconductor region having a high impurity concentration is arranged, drift region 20 accumulates a larger amount of holes in the vicinity of the interface between the semiconductor region and drift region 20 arranged thereunder. As a result, on-resistance can be reduced more significantly.

Apparently, the same effect can be attained if conductivity types (p-type and n-type) are inverted in the configuration above. Apparently, the structure and the production method described above can be implemented irrespective of materials for semiconductor substrate 100, gate electrode 60, and the like to attain the same effect.

As described above, to implement a semiconductor device having a carrier accumulation layer, the related techniques need a process of forming a carrier accumulation layer, which leads to an increase in the number of steps in production of the semiconductor device. Moreover, in the method of disposing a carrier accumulation layer having a higher impurity concentration than that of the semiconductor device in a drift region, the depletion layer does not expand well, and the trade-off between the breakdown voltage and the on-voltage cannot be sufficiently attained.

The applicants have found that the on-resistance can be reduced by increasing the width of the groove in IGBTs. Such an increase in the width of the groove in the structures of IGBTs, however, increases reverse transfer capacitance Crss.

The embodiment described above can sufficiently attain the trade-off between the breakdown voltage and the on-voltage, and provide a trench gate type semiconductor device having reduced reverse transfer capacitance.

Thus, the invention, off course, includes various embodiments which have not been described herein. Accordingly, the technical scope of the invention is determined only by particular matters of the invention according to the scope of claims.

The semiconductor device according to the invention can be used in applications of trench gate type semiconductor devices performing switching operation.

The invention claimed is:

1. A semiconductor device comprising:
a first semiconductor region of a first conductivity type;
a second semiconductor region of a second conductivity type arranged on the first semiconductor region;
a third semiconductor region of the first conductivity type arranged on the second semiconductor region;
a fourth semiconductor region of a second conductivity type arranged on the third semiconductor region;
a groove extending from a top surface of the fourth semiconductor region and reaching the second semiconductor region through the fourth semiconductor region and the third semiconductor region;
an insulation film arranged on an inner wall of the groove,
a control electrode arranged on the insulation film at a side surface of the groove, the control electrode facing the third semiconductor region;
a connection groove connected to ends of the groove, the connection groove extending from the top surface of the fourth semiconductor region and reaching the second semiconductor region through the fourth semiconductor region and the third semiconductor region;
a first main electrode electrically connected to the first semiconductor region,
a second main electrode electrically connected to the fourth semiconductor region; and
a bottom electrode arranged on the insulation film at a bottom surface of the groove and spaced from the control electrode,
wherein—
the bottom electrode comprises a body arranged at the bottom surface of the groove and a connection portion electrically connected to the main body,
in plan view, the body is formed in a strip form, and extends in an extending direction of the groove, and the connection portion extends in a depth direction of the groove and is connected to an end of the body in the extending direction of the body,
the body of the bottom electrode is arranged in the groove, and the connection portion of the bottom electrode is arranged in the connection groove, and
in plan view, a length of the groove in the extending direction of the groove is larger than a width of the groove, and the width of the groove is larger than a gap between the groove and an adjacent groove.

2. The semiconductor device according to claim 1, wherein
the groove has a width of 3 μm to 20 μm,
the groove has a depth of 2 μm to 10 μm,
the second semiconductor region has a thickness of 40 μm to 140 μm, and
the second semiconductor region has a resistivity of 10 Ωcm to 150 Ωcm.

3. The semiconductor device according to claim 1, wherein—
an interface between the second semiconductor region and the third semiconductor region is located between the adjacent groove, and
the interface in a region far from the groove is located closer to the first semiconductor region than the interface in regions adjoining the groove is.

4. The semiconductor device according to claim 1, wherein a length of the bottom electrode in a widthwise direction of the groove is larger than the gap between the adjacent groove.

5. The semiconductor device according to claim 1, wherein the width of the groove is larger than a depth of the groove, and the width of the groove is 3 to 20 μm.

6. The semiconductor device according to claim 1, wherein the bottom electrode is arranged to face 70% or more of the bottom surface of the groove.

7. A semiconductor device comprising:
a groove formed on a front surface of a semiconductor substrate;
a gate electrode arranged in contact with an oxide film formed on an inner surface of the groove;
a first main electrode formed on the front surface of the semiconductor substrate; and
a second main electrode formed on a back surface of the semiconductor substrate;
switching of an operating current flowing between the first main electrode and the second main electrode being controlled by a voltage applied to the gate electrode,
wherein
the gate electrode is at least partially removed from a bottom surface of the groove,
a bottom electrode separated from the gate electrode is arranged on a portion of the oxide film at the bottom surface of the groove from which the gate electrode is removed,
the bottom electrode is electrically connected to the first main electrode, and
in plan view, a body of the bottom electrode is arranged in the groove, and a connection portion of the bottom electrode is arranged in a connection groove, and each control electrode extends in the groove, in an extending direction of the groove, beyond the connection portion of the bottom electrode and is raised outside of the groove.

8. The semiconductor device according to claim 7, wherein the bottom electrode comprises a body arranged on the bottom surface of the groove, and a connection portion electrically connecting the body to the second main electrode,
wherein, in plan view, the body is formed in a strip shape and extends in the extending direction of the groove, and the connection portion extends in the depth direction of the groove, and
a dimension of the body in the depth direction of the groove is larger than a dimension of the connection portion in the depth direction of the groove.

9. The semiconductor device according to claim 1, wherein
the groove include groove arranged side by side,
the adjacent groove are connected to each other through the connection groove,
the connection groove is formed extending from the top surface of the fourth semiconductor region and reaching the second semiconductor region through the third semiconductor region, and the width of the connection groove is larger than the gap between the adjacent groove,
the bottom electrode includes the body arranged on the bottom surface of the groove, and the connection portion electrically connecting the body to the second main electrode,
in plan view, the body is formed in the strip shape and extends in the extending direction of the groove, and the connection portion extends in the depth direction of the groove,
the body is arranged inside the connection groove, and
a width of the connection portion is larger than a width of the body.

10. The semiconductor device according to claim 1, wherein the groove includes groove arranged side by side,
the adjacent groove are connected to each other through the connection groove,
the connection groove is formed extending from the top surface of the fourth semiconductor region and reaching the second semiconductor region through the third semiconductor region, and
the control electrodes are connected to each other on an inner side surface of the connection groove.

11. The semiconductor device according to claim 1, wherein
the bottom electrode includes the body arranged on the bottom surface of the groove, and the connection portion electrically connecting the body to the second main electrode,
in plan view, the body is formed in the strip shape and extends in the extending direction of the groove, and the connection portion extends in the depth direction of the groove,
the groove includes groove arranged side by side,
the adjacent groove are connected to each other through the connection groove,
the connection groove is formed extending from the top surface of the fourth semiconductor region and reaching the second semiconductor region through the third semiconductor region,
an end of the body is arranged inside the connection groove,
the control electrode is connected to a bus line through a connection portion of the control electrode,
the connection portion of the control electrode includes:
a first portion formed on an inner side surface of the connection groove,
a second portion connected to the first portion, and formed on a bottom surface of the connection groove to extend between the ends of the bodies adjacent to each other, and
a third portion connected to the second portion and formed on an outer side surface of the connection groove, and
a dimension of the second portion in the depth direction of the groove is smaller than a dimension of the control electrode in the depth direction of the groove.

12. A semiconductor device comprising:
a groove formed on a front surface of a semiconductor substrate;
a gate electrode arranged in contact with an oxide film formed on an inner surface of the groove;
a first main electrode formed on the front surface of the semiconductor substrate; and
a second main electrode formed on a back surface of the semiconductor substrate;
wherein
switching of an operating current flowing between the first main electrode and the second main electrode is controlled by a voltage applied to the gate electrode,
the gate electrode is at least partially removed from a bottom surface of the groove,
a bottom electrode separated from the gate electrode is arranged on a portion of the oxide film at the bottom surface of the groove from which the gate electrode is removed,
the bottom electrode is electrically connected to the first main electrode via a connection portion of the bottom electrode, and
a dimension of an extending portion of the gate electrode in the depth direction of the groove is smaller than a dimension of the gate electrode in the depth direction of the groove, the extending portion of the gate electrode facing the connection portion of the bottom electrode.

13. The semiconductor device according to claim 12, wherein
the extending portion of the gate electrode extends in the groove, in an extending direction of the groove, beyond the connection portion of the bottom electrode and is raised outside of the groove.

* * * * *